United States Patent [19]

Bhatia

[11] Patent Number: 5,982,630

[45] Date of Patent: Nov. 9, 1999

[54] PRINTED CIRCUIT BOARD THAT PROVIDES IMPROVED THERMAL DISSIPATION

[75] Inventor: Rakesh Bhatia, San Jose, Calif.

[73] Assignee: Intel Corporation, Santa Clara, Calif.

[21] Appl. No.: 08/965,354

[22] Filed: Nov. 6, 1997

[51] Int. Cl.$^6$ ....................................................... H05K 7/10
[52] U.S. Cl. ............................ 361/767; 216/20; 361/707; 361/719; 361/764
[58] Field of Search .................................... 361/707, 712, 361/719, 720, 760, 764, 767, 774, 808; 216/13, 20; 174/260

[56] References Cited

U.S. PATENT DOCUMENTS 5,332,869  7/1994  Hagiwara .............................. 216/13 X
5,746,927  5/1998  Hashimoto et al. ................... 216/20 X

*Primary Examiner*—William Powell
*Attorney, Agent, or Firm*—David J. Kaplan

[57] ABSTRACT

A printed circuit board to support an integrated circuit and provide thermal dissipation. A layer of thermally conductive material is disposed between lower and upper dielectric layers. Above this structure is disposed another layer of thermally conductive material to be thermally coupled to an integrated circuit. A thermal via couples the two layers of thermally conductive material to each other.

20 Claims, 2 Drawing Sheets

PRINTED CIRCUIT BOARD THAT PROVIDES IMPROVED THERMAL DISSIPATION

FIELD OF THE INVENTION

The present invention relates to computer systems and more particularly to thermal dissipation of the heat generated by integrated circuits on a printed circuit board in a computer system.

BACKGROUND OF THE INVENTION

Computer systems and other electronic components typically contain one or more integrated circuits (ICs). High-speed ICs that consume a lot of power (on the order of a few Watts or more), such as, for example, processors and chipsets, require that the heat generated by the IC be conducted away from the IC and dissipated. If the heat generated by the IC is not removed, performance of the IC is degraded. In some cases, an IC can become so hot that it will actually destroy itself, causing the computer system to stop functioning. Therefore, it is necessary to design heat removal systems into computer systems that use high-speed ICs.

A heat removal system typically comprises some mechanism to transfer heat from the IC and to dissipate the heat to the ambient environment. Transferring heat from the IC is done using a thermally conductive material, such as copper or aluminum, thermally coupled to the IC. The heat is then dissipated by either increasing the surface area for the heat to dissipate from, increasing air flow (or liquid flow) across a heated surface, or both. Some heat sinks include fins and heat spreader plates that increase heat dissipation surface area. Other heat sinks use a fan to blow air across a surface.

ICs in a computer system are mounted on one or more printed circuit boards (PCBs) that provide a durable substrate base for the ICs. One important feature of a PCB is that the PCB includes electrical interconnects printed onto one or more surfaces of the PCB. These electrical interconnects are coupled to the ICs mounted on the PCB. The electrical interconnects are designed to electrically couple various ICs together in a useful manner on the PCB.

Some PCBs include multiple layers of electrical interconnects, called signal layers. These multiple signal layers increase the degree of integration of the PCB by allowing signals to be routed across electrical interconnects that pass under or over other ICs or electrical interconnects of the PCB rather than around them. For example, a PCB may have signal layers formed on both the top and bottom of the PCB substrate. This effectively doubles the available PCB area for mounting ICs and other components as compared to a PCB that only has a signal layer on one side of the substrate. Signal layers are also formed within the PCB substrate, between the upper and lower PCB surfaces.

Interspersed between these signal layers are ground and power planes, each separated by a dielectric material typically comprising fiberglass. ICs and other components coupled to the PCB tap their ground and power sources from the ground and power planes within the PCB.

Unfortunately, the need to thermally dissipate heat generated by ICs mounted to one side of a PCB can have the effect of limiting the available electrical interconnect space on the opposite side of the PCB. This is because through-holes are made through the PCB to thermally couple an IC mounted on top of a PCB to a heat sink mounted directly beneath the IC on the bottom of the PCB. The through-holes and heat sink prevent electrical interconnects of the signal layer printed on the bottom of the PCB from crossing through this region. In addition, ground planes, power planes, and electrical interconnects of signal layers formed within the PCB, between the upper and lower PCB surfaces, must be routed around the through-holes formed through the PCB. As a result, the size of the PCB increases to accommodate the re-routing of the electrical interconnects. This increases the manufacturing cost, increases the size of the electronic component containing the PCB, and decreases the desirability of the final product to the consumer.

SUMMARY OF THE INVENTION

A printed circuit board is described that supports an integrated circuit and provides thermal dissipation. A layer of thermally conductive material is disposed between lower and upper dielectric layers. Above this structure is disposed another layer of thermally conductive material to be thermally coupled to an integrated circuit. A thermal via couples the two layers of thermally conductive material to each other.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A printed circuit board (PCB) is described that supports integrated circuits (ICs) and their associated interconnect lines, ground planes, and power planes. In addition, the PCB provides thermal dissipation for the ICs mounted to the PCB. For one embodiment, the PCB comprises signal layers of copper interconnects formed on both the upper and lower surfaces of the PCB. Between the upper and lower surfaces of the PCB is a copper ground plane that is electrically isolated from the upper and lower signal layers by fiberglass boards. Additional signal layers, ground planes, and power planes are also included in the PCB between the upper and lower surfaces, each electrically isolated from one another by fiberglass boards. The necessary interlayer electrical contacts are made through the boards.

On the upper surface of the PCB is a copper pad etched from the pressed copper layer from which the signal layer on the upper surface of the PCB is etched. For one embodiment, the copper pad is fortified with a copper insert thermally coupled to the underlying pressed copper layer. The copper pad is thermally coupled to copper thermal vias that are thermally coupled to the ground plane of the PCB. The IC is mounted on the copper pad or insert such that a good thermal coupling is made between the pad or insert and the IC. The IC is electrically coupled to the electrical interconnects of the signal layer on the upper surface of the PCB. Note that the term "IC", as used herein, includes the semiconductor chip as well as its package.

During operation of the electronic component that includes the above-described IC-mounted PCB, the IC heats up. Heat from the IC is conducted through the copper pad that underlies the IC, through the thermal vias thermally coupled to the pad, and to the ground plane within the PCB to which the thermal vias are thermally coupled. The ground plane then acts as a spreader plate, dissipating the heat generated by the IC by spreading the heat out along the entire ground plane, through the PCB, and into the ambient.

Because the thermal vias do not extend all the way to the bottom of the PCB, the lower surface of the PCB remains available for electrical interconnect signal routing in the lower signal layer and in signal layers within the PCB. In particular, the region of the lower surface of the PCB that resides directly below the pad on the upper surface is unencumbered by obstructions due to thermal dissipation through-holes. Therefore, electrical interconnects and ICs reside in the lower signal layer of the PCB in this region resulting in greater PCB compaction and integration.

A more detailed description of the present invention, including various configurations and implementations in accordance with alternate embodiments of the present invention, is provided below.

Figure 1:
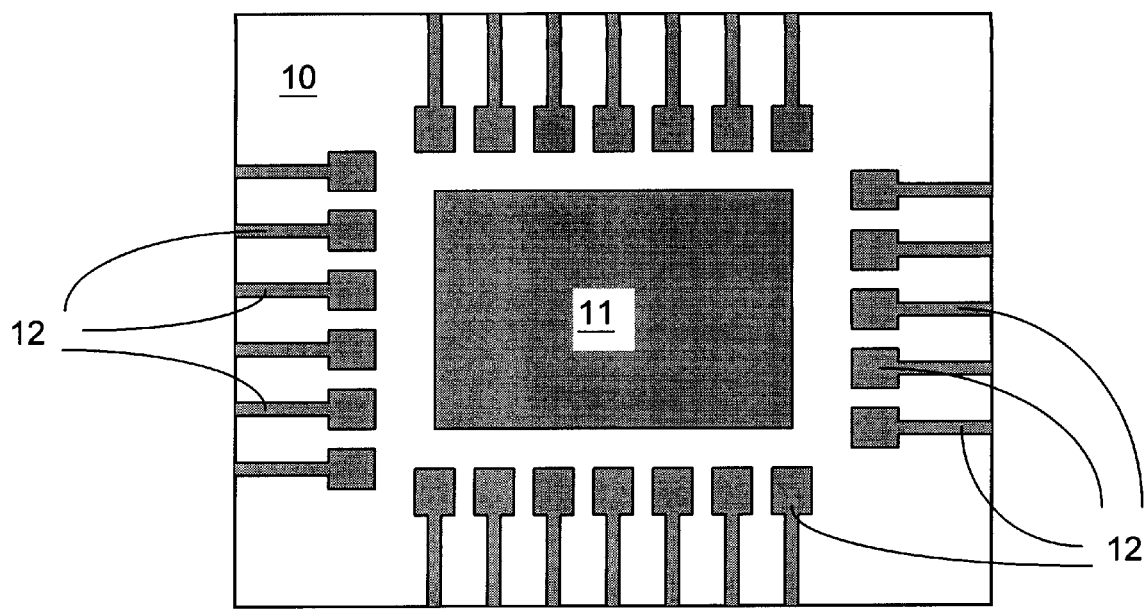
FIG. 1 is a top view of a printed circuit board in accordance with an embodiment of the present invention.

FIG. 1 is a top view of a PCB in accordance with an embodiment of the present invention in which pad 11 and electrical interconnects of signal layer 12 are disposed on dielectric layer 10. Pad 11 is a thermally conductive material such as copper. Electrical interconnects of signal layer 12 comprise an electrically conductive material such as copper. Dielectric layer 10 is a dielectric material such as fiberglass. Pad 11 is to be thermally coupled to an IC mounted to the PCB, and the leads of the IC are to be electrically coupled to the pads of the electrical interconnects of signal layer 12 located around the periphery of pad 11.

In accordance with one embodiment of the present invention, pad 11 and the electrical interconnects of signal layer 12 of FIG. 1 are formed by pressing a copper sheet onto the surface of dielectric layer 10 of the PCB, printing the pad and interconnect pattern onto the surface of the copper sheet, and etching the pattern into the copper sheet. For this embodiment, because the pad and the signal layer are formed from the same layer of copper, the pad and signal layer reside in the same plane on the surface of the PCB. For an alternate embodiment of the present invention, the pad and interconnects are formed from other suitable materials having appropriate thermal and electrical properties such as, for example, aluminum, gold, silver, or other metal. The dielectric material may alternatively be plastic, glass, or other electrically insulative material.

For one embodiment of the present invention, it may be desirable that pad 11 of FIG. 1 be made as large as possible without contacting any of the surrounding electrical interconnects of signal layer 12. In addition, to improve the thermal properties of the pad, the pad may include a thermal insert of thermally conductive material that is thermally coupled to the underlying pressed copper layer. This insert has the effect of providing a thicker pad to which the IC is thermally coupled, thereby providing for better thermal conductance by the pad. For another embodiment, pad 11 comprises only the thermal insert without the underlying pressed copper layer portion of the pad. For an alternate embodiment of the present invention, pad 11 comprises two or more smaller pads that are electrically or thermally isolated from one another, both of which being configured for thermal coupling to the IC.

Figure 2:
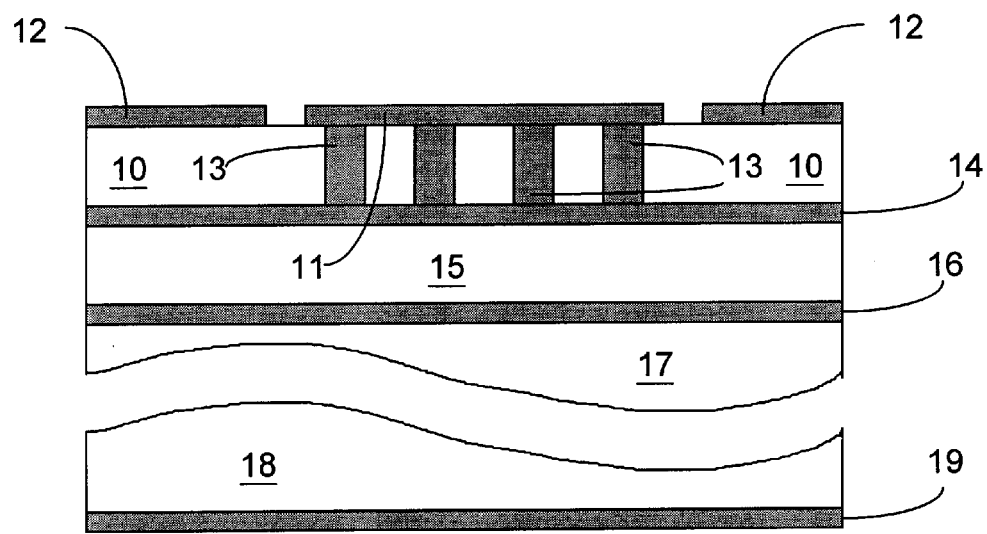
FIG. 2 is a cross section of the printed circuit board of FIG. 1.

FIG. 2 is a cross section of the PCB of FIG. 1. Upper signal layer 12, comprising electrical interconnects, and Pad 11 are disposed on top of dielectric layer 10 which electrically separates signal layer 12 from ground plane 14. Thermal vias 13 thermally couple pad 11 to ground plane 14. Dielectric layer 15 electrically separates signal layer 16 from ground plane 14. Dielectric layer 17 electrically separates signal layer 16 from other ground planes, signal layers, and power planes that may additionally be formed between dielectric layers 17 and 18. Lower signal layer 19, comprising electrical interconnects, is disposed on the lower surface of dielectric layer 18, and dielectric layer 18 electrically separates signal layer 19 from the other ground planes, signal layers, and power planes of the PCB.

In accordance with one embodiment of the present invention, a ground plane is a layer of electrically conductive interconnects that are designed to be coupled to ground or the negative terminal of a battery during operation of the PCB. A power plane is a layer of electrically conductive interconnects that are designed to be coupled to the voltage supply or the positive terminal of a battery during operation of the PCB. ICs and other devices mounted to the PCB tap the ground and power planes by way of electrical vias through the PCB dielectric layers to provide for proper operation of the ICs. For one embodiment of the present invention, the electrical interconnects of the signal layers, the ground planes, and the power planes comprise an electrically conductive material such as copper or other metal. The dielectric layers comprise an electrically insulative material such as fiberglass or other dielectric material. The thermal vias and pad comprise a thermally conductive material such as copper or other metal.

A thermal via is a thermally conductive conduit through which heat is conducted at one layer of a PCB and is transferred through at least one dielectric layer to another layer of the PCB. Referring again to FIG. 2, thermal vias 13 are formed by drilling holes through dielectric layer 10 and electroplating those holes with copper before dielectric layer 10 is affixed onto the remainder of the underlying PCB substrate comprising ground plane 14 and dielectric layer 15. One unique aspect of thermal vias 13 of FIG. 2 that differentiates these vias from a PCB through-hole is that a through-hole extends from one surface of the PCB to the other. In contrast, thermal vias 13 terminate within the PCB. Because thermal vias 13 are not visible from the bottom of the PCB of FIG. 2 (as a through-hole would be), thermal vias 13 are sometimes referred to as blind vias.

In accordance with an alternate embodiment of the present invention, thermal vias are formed by drilling, routing, or punching holes or slots in the dielectric layer. Tabs that are connected to a thermal insert are then inserted through the holes or slots so that contact is made between the tabs and the underlying ground plane. The IC is then mounted to the thermal insert.

For an alternate embodiment, the thermal via extends through more than one dielectric layer of the PCB, and is coupled to one or more ground planes in the PCB. Alternatively, the thermal via is coupled to one or more power planes of the PCB. For another embodiment, a dedicated, electrically floating, thermally conductive layer is disposed in the PCB, and the thermal via is coupled to this layer.

Because the thermal vias terminate within the PCB, the electrical interconnects of signal, ground, and power planes that reside below the termination point of the thermal vias do not need to be routed to circumvent the region of the PCB directly beneath the pad. For example, the electrical interconnects of signal layers 16 and 19 of FIG. 2 are routed in the region directly beneath pad 11 because thermal vias 13 that thermally couple pad 11 to ground plane 14 terminate at ground plane 14, so there is no obstruction of underlying layers. This allows for greater integration density and smaller PCB form factors in comparison to the use of through-holes for thermally coupling an IC on one surface of a PCB to a thermal dissipation device on the opposite surface of the PCB.

Figure 3:
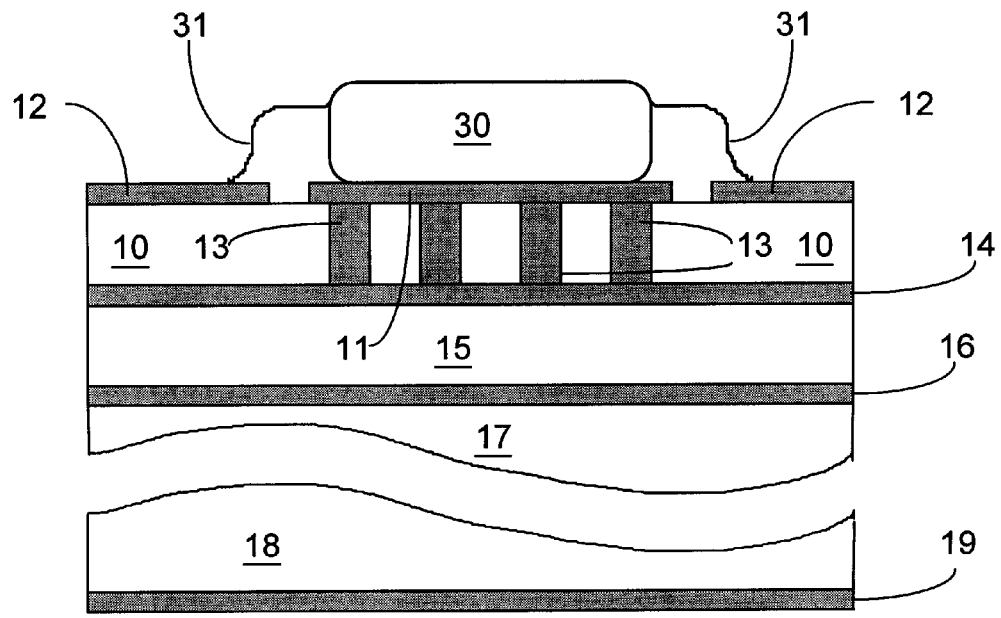
FIG. 3 is a cross section of the printed circuit board of FIG. 1 including an integrated circuit in accordance with one embodiment of the present invention.

FIG. 3 is a cross section of the printed circuit board of FIG. 1 to which IC 30 has been mounted. IC 30 is mounted to the PCB such that a good thermal coupling is made between IC 30 and pad 11. For one embodiment of the present invention, a thermal grease, thermal pad, or other thermally conductive film is used at the interface between the IC and the pad to improve the thermal coupling. Leads in the form of pins 31 of the IC are electrically coupled to the associated electrical interconnects of signal layer 12 of the PCB. For one embodiment, the PCB includes other ICs mounted to the upper or lower surfaces of the PCB and electrically coupled to signal layers 12 and 13, respectively.

During operation of the electronic component that contains the PCB of FIG. 3, IC 30 heats up. This heat is transferred to pad 11, through thermal vias 13, to ground plane 14. Ground plane 14 then serves as a heat spreader, dissipating the heat by quickly spreading the heat through the thermally (and electrically) conductive ground plane and, consequently, throughout the entire PCB where the heat is lost to the ambient. For one embodiment of the present invention, other ICs are thermally coupled to the ground plane in other regions of the PCB. For another embodiment, an external heat sink is thermally coupled to the ground plane to provide more effective heat dissipation.

Figure 4:
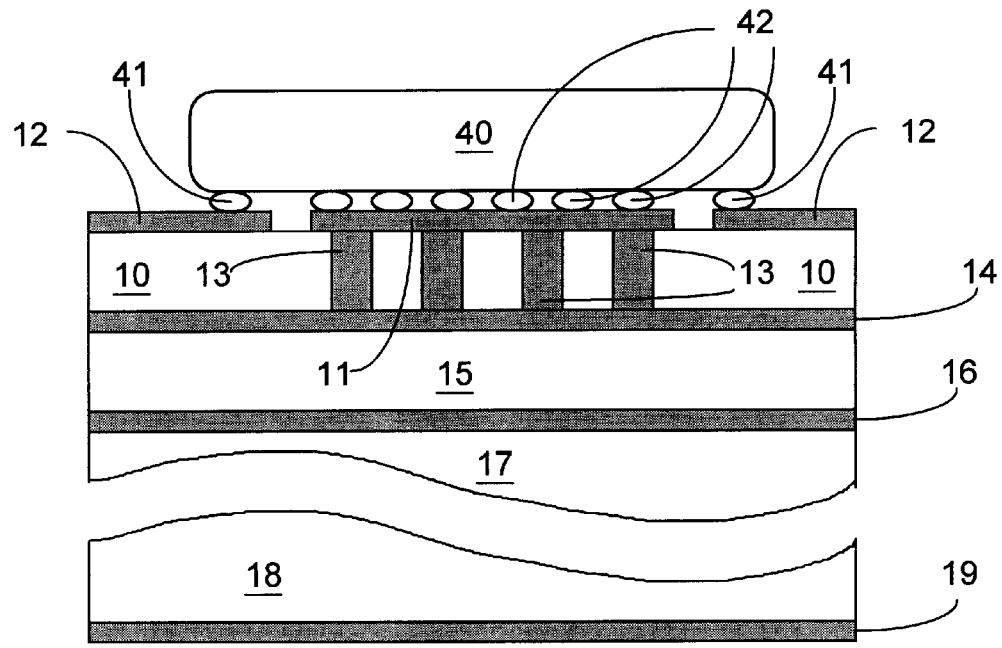
FIG. 4 is a cross section of the printed circuit board of FIG. 1 including an integrated circuit in accordance with another embodiment of the present invention.

FIG. 4 is a cross section of the printed circuit board of FIG. 1 to which IC 40 has been mounted. IC 40 is mounted to the PCB such that a good thermal coupling is made between IC 40 and pad 11. This thermal coupling is accomplished by soldering IC 40 to pad 11 using thermal solder balls 42. Thermal solder balls are solder balls that are formed on an IC package, such as a ball grid aray (BGA) package, near thermal vias that thermally couple the semiconductor substrate inside the package to external pads outside the package. Leads in the form of solder balls 41 of the IC are electrically coupled to the associated electrical interconnects of signal layer 12 of the PCB. For one embodiment, the PCB includes other ICs mounted to the upper or lower surfaces of the PCB and electrically coupled to signal layers 12 and 13, respectively.

During operation of the electronic component that contains the PCB of FIG. 4, IC 40 heats up. This heat is transferred, via IC thermal vias, to thermal solder balls 42, to pad 11, through thermal vias 13, to ground plane 14. Ground plane 14 then serves as a heat spreader in the manner described above in conjunction with FIG. 3. For one embodiment of the present invention, other ICs are thermally coupled to the ground plane in other regions of the PCB. For another embodiment, an external heat sink is thermally coupled to the ground plane to provide more effective heat dissipation.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. A printed circuit board (PCB) to support an integrated circuit (IC), the PCB comprising:

a first layer of dielectric material;

a second layer of thermally conductive material disposed above the first layer;

a third layer of dielectric material disposed above the second layer; and a pad of thermally conductive material thermally coupled to the second layer by a thermal via and disposed above the third layer, the pad to be thermally coupled to the IC, the via terminating within the PCB.

2. The PCB of claim 1, further comprising an upper signal layer disposed above the third layer in a same plane as the pad, the upper signal layer comprising a plurality of electrical interconnects to be electrically coupled to the IC.

3. The PCB of claim 1, further comprising a lower signal layer disposed below the first layer, the lower signal layer comprising a plurality of electrical interconnects routed directly beneath the pad.

4. The PCB of claim 1, further comprising a plurality of thermal vias thermally coupled to the pad at a first end and the second layer at a second end.

5. The PCB of claim 1, wherein the via is thermally coupled to the pad at a first end and the second layer at a second end.

6. The PCB of claim 1, wherein the second layer is a ground plane of the PCB.

7. The PCB of claim 1, wherein the fourth layer comprises a thermally conductive insert thermally coupled to the second layer by a tab inserted through the via.

8. A printed circuit board (PCB) to support an integrated circuit (IC), the PCB comprising:

a first layer comprising fiberglass;

a second layer comprising copper disposed above the first layer;

a third layer comprising fiberglass disposed above the second layer;

a copper pad disposed above the third layer to thermally couple to the IC; and a thermal via thermally coupled to the pad and to the second layer.

9. The PCB of claim 8, further comprising an upper signal layer disposed above the third layer in a same plane as the pad, the upper signal layer comprising a plurality of copper interconnects to be electrically coupled to the IC.

10. The PCB of claim 8, further comprising a lower signal layer disposed below the first layer, the lower signal layer comprising a plurality of copper interconnects directly beneath the pad.

11. The PCB of claim 8, further comprising a plurality of thermal vias thermally coupled to the pad at a first end and the second layer at a second end.

12. The PCB of claim 11, wherein the second layer is a ground plane of the PCB.

13. The PCB of claim 8, wherein the second layer is a ground plane of the PCB.

14. The PCB of claim 8, wherein the pad comprises a copper insert thermally coupled to the second layer by a copper tab inserted through the via.

15. An electronic component comprising:
a printed circuit board (PCB) comprising a first layer of dielectric material,
   a second layer of thermally conductive material disposed above the first layer, a third layer of dielectric material disposed above the second layer, and a pad of thermally conductive material disposed above the third layer;
a thermal via thermally coupled to the second layer and the pad;
a first plurality of electrical interconnects disposed on an upper surface of the PCB;
an integrated circuit (IC) disposed on the PCB, electrically coupled to the interconnects and thermally coupled to the pad.

16. The electronic component of claim 15, further comprising a second plurality of electrical interconnects disposed on a lower surface of the PCB directly beneath the IC.

17. The electronic component of claim 16, further comprising a plurality of thermal vias thermally coupled to the pad at a first end and the second layer at a second end.

18. The electronic component of claim 15, further comprising a plurality of thermal vias thermally coupled to the pad at a first end and the second layer at a second end.

19. The electronic component of claim 15, wherein the second layer is a ground plane of the PCB.

20. The electronic component of claim 15, wherein the pad comprises a copper insert and a pressed copper layer.

* * * * *